US010320307B2

(12) United States Patent
Katagiri

(10) Patent No.: US 10,320,307 B2
(45) Date of Patent: Jun. 11, 2019

(54) AC INPUT/DC OUTPUT POWER SUPPLY AND CONTROL METHOD THEREOF

(71) Applicant: NEC Platforms, Ltd., Kawasaki-shi, Kanagawa (JP)

(72) Inventor: Yoshihiko Katagiri, Kanagawa (JP)

(73) Assignee: NEC PLATFORMS, LTD., Kanagawa (JP)

( * ) Notice: Subject to any disclaimer, the term of this patent is extended or adjusted under 35 U.S.C. 154(b) by 0 days.

(21) Appl. No.: 15/746,487

(22) PCT Filed: Aug. 1, 2016

(86) PCT No.: PCT/JP2016/003534
§ 371 (c)(1),
(2) Date: Jan. 22, 2018

(87) PCT Pub. No.: WO2017/026105
PCT Pub. Date: Feb. 16, 2017

(65) Prior Publication Data
US 2018/0219489 A1 Aug. 2, 2018

(30) Foreign Application Priority Data
Aug. 7, 2015 (JP) .................................. 2015-157120

(51) Int. Cl.
*H02M 7/04* (2006.01)
*H03K 12/00* (2006.01)
(Continued)

(52) U.S. Cl.
CPC ............... *H02M 7/04* (2013.01); *H02M 1/44* (2013.01); *H02M 7/217* (2013.01); *H03K 12/00* (2013.01); *H02M 1/42* (2013.01)

(58) Field of Classification Search
CPC ............ H02M 7/00; H02M 7/04; H02M 1/10; H02M 1/42; H02M 1/44; H02M 7/17;
(Continued)

(56) References Cited

U.S. PATENT DOCUMENTS 4,516,061 A * 5/1985 Neki .................... H02P 29/0016
318/561
5,729,179 A * 3/1998 Sumi .................... H03K 23/667
327/115
(Continued)

FOREIGN PATENT DOCUMENTS

JP S53-129685 A 11/1978
JP S58-210425 A 12/1983
(Continued)

OTHER PUBLICATIONS

International Search Report for PCT Application No. PCT/JP2016/003534, dated Sep. 13, 2016.
(Continued)

*Primary Examiner* — Gustavo A Rosario-Benitez

(57) ABSTRACT

[Issue] To provide a small size, low cost AC input/DC output power supply capable of supplying both a DC voltage and a high-precision clock signal.
[Solution] An AC input/DC output power supply of the present invention includes: a voltage conversion means for taking an AC voltage as input and generating a secondary voltage, splitting the secondary voltage into a first secondary AC voltage and a second secondary AC voltage, and outputting the first and second secondary voltages; a DC voltage generation means for receiving the first secondary AC voltage and outputting a predetermined DC voltage; a waveform shaping means for receiving the second secondary AC voltage and outputting a square wave voltage signal; and a frequency adjustment means for adjusting a frequency
(Continued)

of the square wave voltage signal to be a predetermined frequency, and thereby outputting a clock signal.

13 Claims, 7 Drawing Sheets

(51) Int. Cl.
*H02M 1/44* (2007.01)
*H02M 7/217* (2006.01)
*H02M 1/42* (2007.01)

(58) Field of Classification Search
CPC .......... H02M 7/23; H02M 2001/0019; H02M 7/4826; H02M 2001/007; H02M 7/12; H02M 2001/008; H02M 7/217; H03K 12/00

See application file for complete search history.

(56) References Cited

U.S. PATENT DOCUMENTS

| | | | | |
|---|---|---|---|---|
| 5,811,941 A * | 9/1998 | Barton | ............... | H05B 41/2887 315/247 |
| 5,856,712 A * | 1/1999 | Suzuki | ................... | H02J 9/062 307/64 |
| 5,982,645 A * | 11/1999 | Levran | ............... | H01F 27/2866 307/66 |
| 6,002,278 A * | 12/1999 | Saito | .................... | H03K 23/665 327/115 |
| 6,427,129 B1 * | 7/2002 | Lalla | ..................... | G01D 3/022 702/88 |
| 2013/0170621 A1 | 7/2013 | Saka et al. | | |
| 2013/0243425 A1 * | 9/2013 | Franklin | .............. | H04B 10/116 398/38 |
| 2013/0250624 A1 * | 9/2013 | Fornage | .............. | H02M 7/4807 363/17 |
| 2014/0056034 A1 * | 2/2014 | Hyeon | ............. | H02M 3/33507 363/21.02 |
| 2014/0301118 A1 | 10/2014 | Yabuzaki | | |

FOREIGN PATENT DOCUMENTS

| | | |
|---|---|---|
| JP | S60-3562 A | 1/1985 |
| JP | UH01-72737 U | 5/1989 |
| JP | H08-62356 A | 3/1996 |
| JP | 2007-327871 | 12/2007 |
| JP | 2012-088202 A | 5/2012 |
| JP | 2012-139024 A | 7/2012 |
| JP | 2013-138608 A | 7/2013 |
| JP | 2014-138523 A | 7/2014 |
| JP | 2014-204544 A | 10/2014 |

OTHER PUBLICATIONS

English translation of Written opinion for PCT Application No. PCT/JP2016/003534.

* cited by examiner

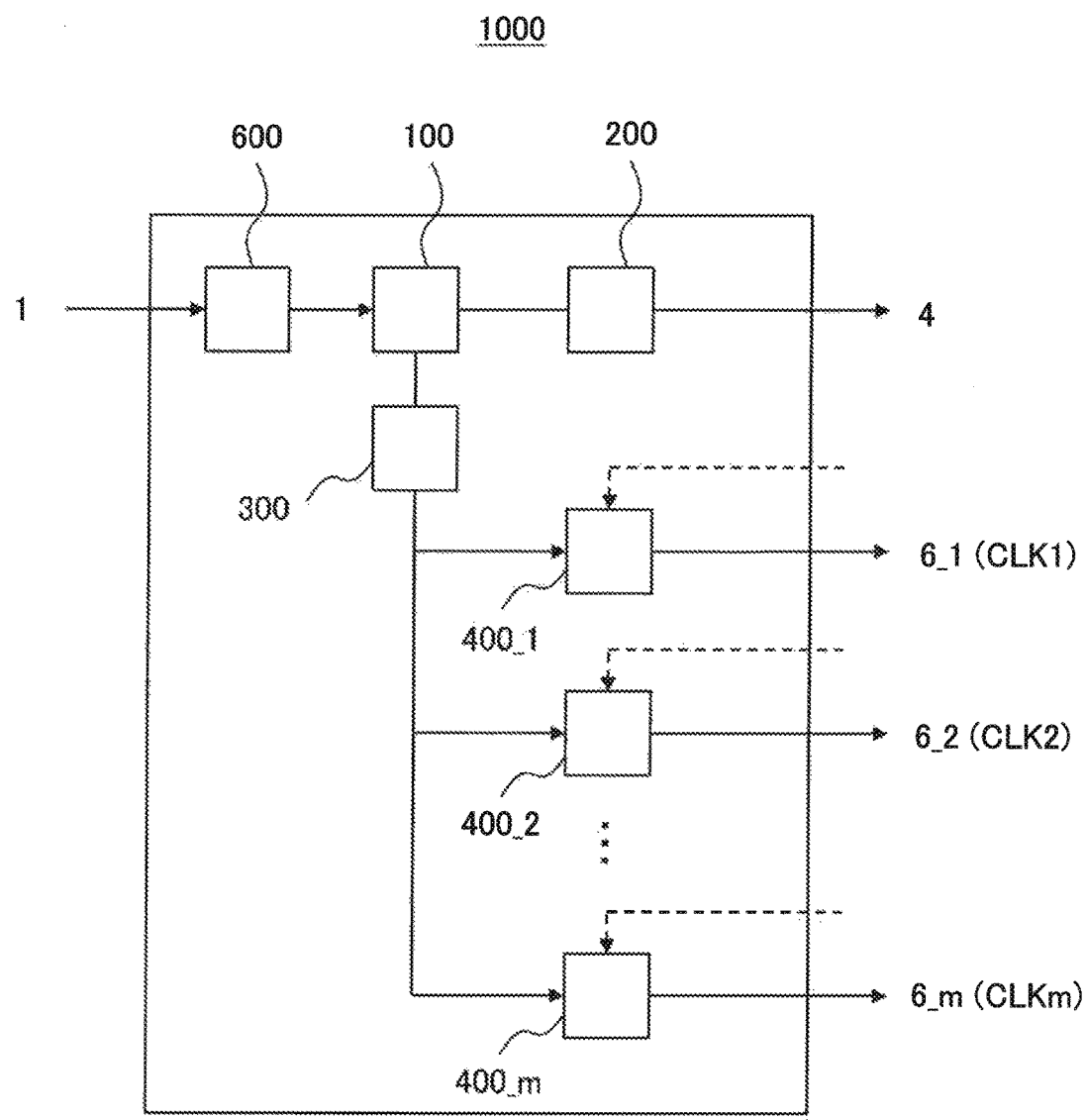

AC INPUT/DC OUTPUT POWER SUPPLY AND CONTROL METHOD THEREOF

This applications is a National Stage Entry of PCT/JP2016/003534 filed Aug. 1, 2016, which claims priority from Japanese Patent Application 2015-157120 filed on Aug. 7, 2015, the contents of all of which are incorporated herein by reference, in their entirety.

TECHNICAL FIELD

The present invention relates to an AC input/DC output power supply and a control method thereof.

BACKGROUND ART

An AC input/DC output power supply employing a commercial power source as input has been widely used. Of such a power supply, improvement has been continuously attempted from various viewpoints. For example, Patent Literature 1 (PTL 1) discloses a technique for increasing efficiency and reducing power consumption. Patent Literature 2 (PTL 2) discloses a technique for preventing breakdown of an electrolytic capacitor. Patent Literature 3 (PTL 3) discloses a technique for improving output voltage accuracy. Patent Literature 4 (PTL 4) discloses a technique for noise reduction.

Most of electric and electronic devices using such power supplies are operated with a clock signal. For a reference vibration generation means for such a clock signal, a quartz resonator, a ceramic resonator or the like is used in most cases, but their accuracy is not so high. In view of that, there has been proposed a method of using a commercial power source frequency, which has high frequency accuracy. A commercial AC power source has a long-term frequency deviation of about 0.167 ppm, which corresponds to an accuracy of more than 30 times that of a generally used quartz resonator. For example, Patent Literature 5 (PTL 5) discloses a technique of a timer device where correction of a timing counter is performed using a commercial power source frequency. Further, Patent Literature 6 (PTL 6) discloses a technique of a pulse generator which generates a pulse whose frequency is an integral multiple of a commercial power frequency, using a PLL (Phase Locked Loop) circuit.

Using an AC input/DC output power supply and a clock generator such as the ones described above, both a DC voltage and a clock signal can be supplied to an electric or electronic device.

Further, also Patent Literature 7 (PTL 7) and Patent Literature 8 (PTL 8) each disclose a related technique.

CITATION LIST

Patent Literature

[PTL 1] Japanese Laid-Open Patent Application No. 2012-139024
[PTL 2] Japanese Laid-Open Patent Application No. 2013-138608
[PTL 3] Japanese Laid-Open Patent Application No. 2014-138523
[PTL 4] Japanese Laid-Open Patent Application No. 2014-204544
[PTL 5] Japanese Laid-Open Patent Application No. 2012-88202
[PTL 6] Japanese Laid-Open Utility Model Application No. 1-72737
[PTL 7] Japanese Laid-Open Patent Application No. 60-003562
[PTL 8] Japanese Laid-Open Patent Application No. 2007-327871

SUMMARY OF INVENTION

Technical Problem

However, a way of using an AC input/DC output power supply according to any one of PTL 1 to PTL 4 and a clock generator according to any one of PTL 5 to PTL 6 raises a problem. The problem is that the power supply and the clock generator need to be provided as separate components. Owing to the necessity of separate provision, size reduction and cost reduction have been difficult.

The present invention has been made in view of the above-described issue. The present invention is aimed at providing a small size, low cost AC input/DC output power supply capable of supplying both a DC voltage and a high-precision clock signal.

Solution to Problem

To resolve the issue, an AC input/DC output power supply of the present invention includes: a voltage conversion means for taking an AC voltage as input and generating a secondary voltage, splitting the secondary voltage into a first secondary AC voltage and a second secondary AC voltage, and outputting the first and second secondary AC voltages; a DC voltage generation means for receiving the first secondary AC voltage and outputting a predetermined DC voltage; a waveform shaping means for receiving the second AC voltage and outputting a square wave voltage signal; and a frequency adjustment means for adjusting a frequency of the square wave voltage signal to be a predetermined frequency, and thereby outputting a clock signal.

Advantageous Effects of Invention

An effect of the present invention is that it becomes possible to provide a small size, low cost AC input/DC output power supply capable of supplying both a DC voltage and a high-precision clock signal.

BRIEF DESCRIPTION OF DRAWINGS

FIG. 7 is a block diagram showing a seventh example embodiment.

DESCRIPTION OF EMBODIMENTS

Figure 1:
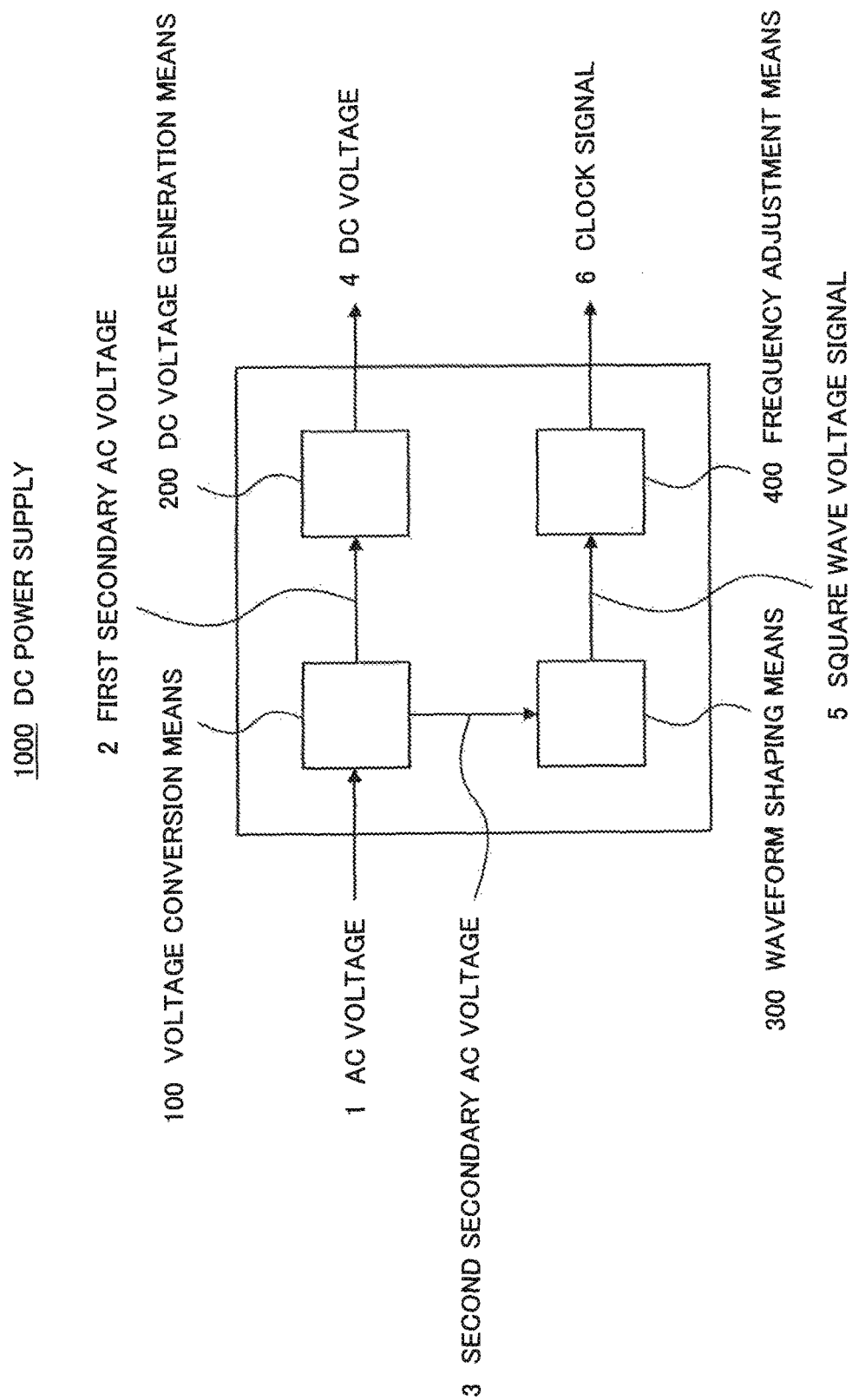
FIG. 1 is a block diagram showing a first example embodiment.

Hereinafter, example embodiments of the present invention will be described in detail, with reference to the drawings. In the example embodiments described below, some restrictions which are technically preferable for implementing the present invention will be made, but they should not limit the scope of the present invention to that of the following descriptions. In the drawings, identical numbers will be assigned to identical constituent elements, and their descriptions may be appropriately omitted.

(First Example Embodiment)

FIG. 1 is a block diagram showing an AC input/DC output power supply of a first example embodiment. The AC input/DC output power supply 1000 includes a voltage conversion means 100, a DC voltage generation means 200, a waveform shaping means 300 and a frequency adjustment means 400.

The voltage conversion means 100 receives input of an AC voltage 1 and converts it into a secondary AC voltage. Then, the voltage conversion means 100 splits the secondary AC voltage into a first secondary AC voltage 2 and a second secondary AC voltage 3, and outputs the first and second secondary AC voltages 2 and 3.

The DC voltage generation means 200 receives the first secondary AC voltage 2 and outputs a predetermined DC voltage 4.

The waveform shaping means 300 receives the second secondary AC voltage 3 and outputs a square wave voltage signal 5.

The frequency adjustment means 400 receives the square wave voltage signal 5, adjusts a frequency of the square wave voltage signal 5 to be a predetermined value, and thereby outputs a clock signal 6.

As has been described above, according to the present example embodiment, it is possible to configure an AC input/DC output power supply which simultaneously outputs a DC voltage and a clock signal from a single AC power source.

(Second Example Embodiment)

Figure 2:
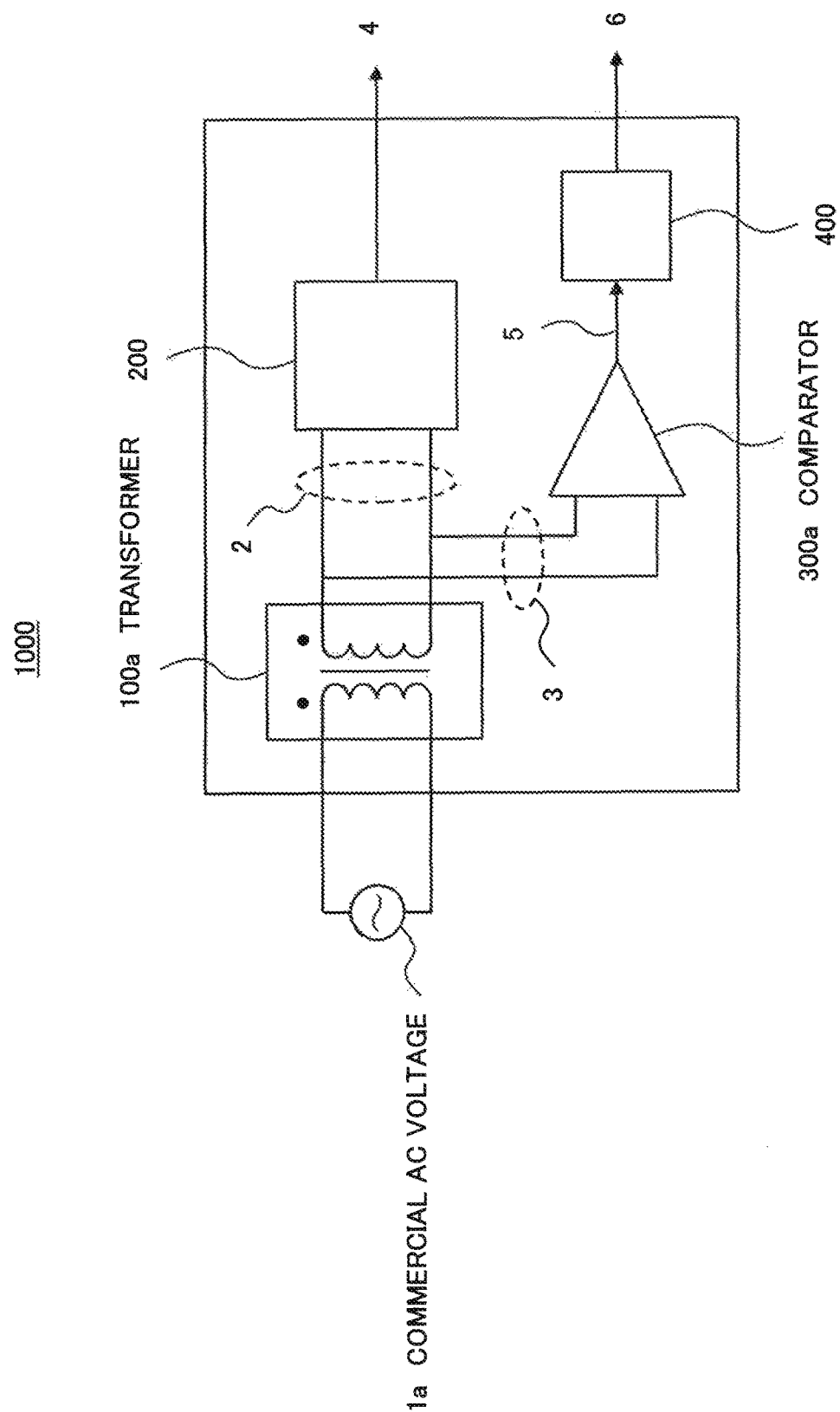
FIG. 2 is a block diagram showing a second example embodiment.

FIG. 2 is a block diagram showing a second example embodiment. In the present example embodiment, an example of a specific configuration of the AC input/DC output power supply 1000 will be described. The AC input/DC output power supply 1000 includes a transformer 100a as the voltage conversion means (100) and a comparator 300a as the waveform shaping means 300. Further, in the present example, a commercial AC voltage 1a is employed as input.

Next, operation will be described. The transformer 100a converts the commercial AC voltage 1a into a predetermined secondary voltage, and outputs the first secondary AC voltage 2 and the second secondary AC voltage 3. The DC voltage generation means 200 generates the predetermined DC voltage 4 from the first secondary AC voltage, and outputs the predetermined DC voltage 4. For the DC voltage generation, various well-known techniques may be used.

The comparator 300a receives the second secondary AC voltage and outputs the square wave voltage signal. For example, the comparator 300a operates such that it outputs a logical 1 when the input voltage is equal to or higher than a threshold value, and outputs a logical 0 when the input voltage is lower than the threshold value. By the operation, the comparator 300a generates and outputs the square wave voltage signal 5 from the second secondary AC voltage 3 which is input in the form of a sine wave or the like. The frequency adjustment means 400 adjusts a frequency of the square wave voltage signal 5 to be a predetermined value, and thereby generates and outputs the clock signal 6. Details of a method of the frequency adjustment will be described later.

As has been described above, according to the present example embodiment, it is possible to provide an AC input/DC output power supply which simultaneously outputs a DC voltage and a clock signal from a single AC power source, using only a simple configuration.

(Third Example Embodiment)

Figure 3:
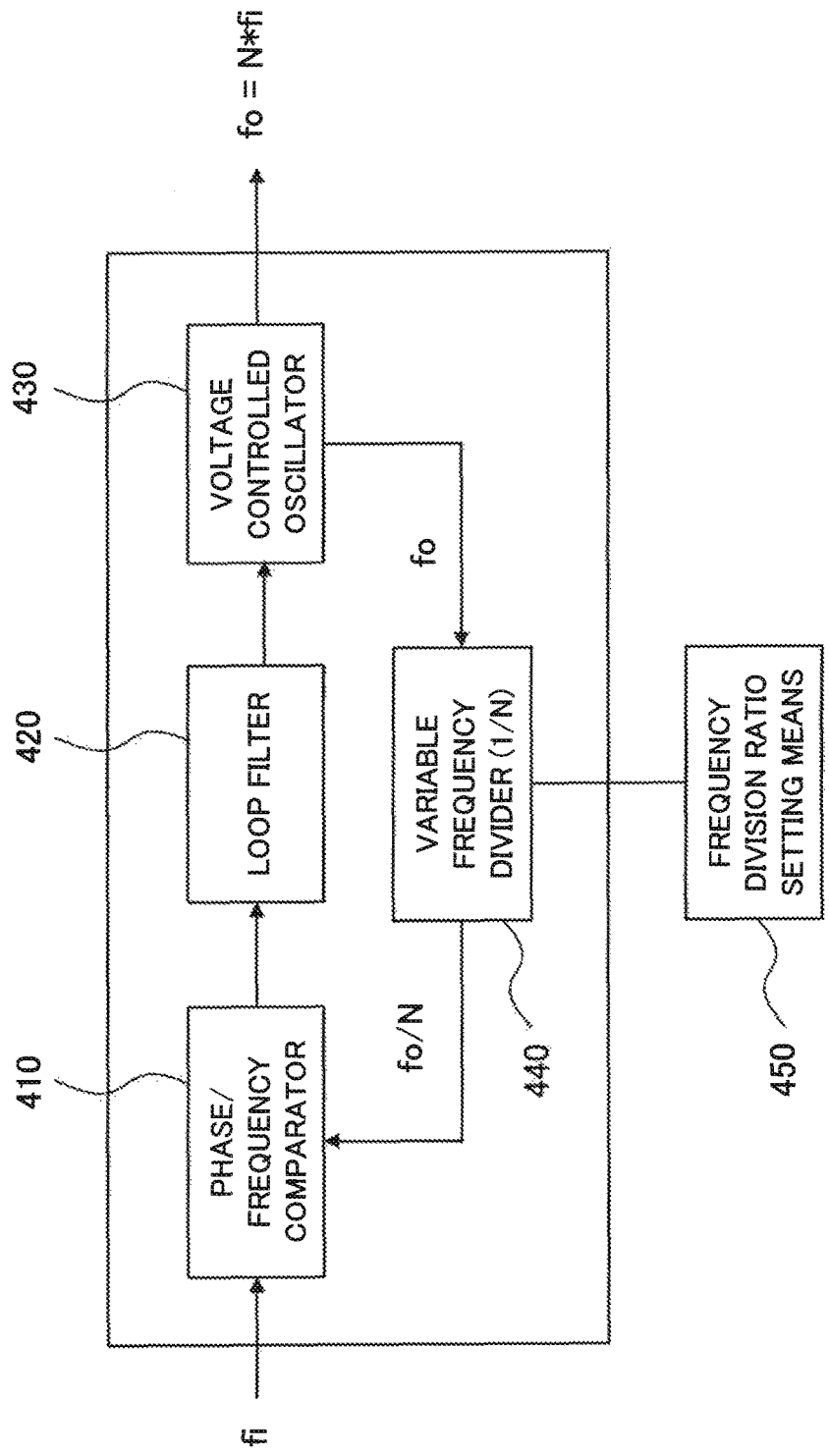
FIG. 3 is a block diagram showing a third example embodiment.

FIG. 3 is a block diagram showing a specific configuration of the frequency adjustment means 400. The frequency adjustment means 400 includes a phase/frequency comparator 410, a loop filter 420, a voltage controlled oscillator 430 and a variable frequency divider 440. This configuration corresponds to the one called a PLL (Phase Locked Loop) frequency synthesizer. Further, a frequency division ratio setting means 450 is coupled to the variable frequency divider 440, so that a frequency division ratio of the variable frequency divider 440 can be set from the outside. The frequency adjustment means 400 accepts reference signal of a frequency fi, and output pulse signal of a frequency fo which depends on a frequency division ratio which is set by the frequency division ratio setting means 450.

The phase/frequency comparator 410 compares the phases of two input pulse signals, and outputs an error pulse signal whose voltage is promotional to the phase difference.

The loop filter 420 generates a DC signal by averaging the error pulse signals and outputs the DC signal.

The voltage controlled oscillator 430 is an oscillator having a range in which its output frequency changes linearly with its input voltage. Its input is the DC signal which is output by the loop filter, and its output is a pulse signal whose frequency have been adjusted in accordance with the DC signal.

The variable frequency divider 440 converts the frequency of signal fo input from the voltage controlled oscillator 430 into the frequency fo/N, and outputs the converted signal.

Next, operation of the frequency adjustment means 400 will be described. Here, it is assumed that a frequency division ratio N (N is an integer) has been set to the variable frequency divider 440.

A reference signal with frequency fi and a signal with frequency fo/N are input to the phase/frequency comparator 410. The phase/frequency comparator 410 outputs an error pulse signal whose voltage is proportional to a phase difference between the two signals. The error pulse signal is converted into a DC signal by the loop filter 420, and the DC signal is input to the voltage controlled oscillator 430. The voltage controlled oscillator 430 adjusts its output frequency fo in such a way that fo is increased when fi>fo/N and decreased when fi<fo/N. In that way, the frequency fo is adjusted to keep a condition fi=fo/N. As a result, the output signal frequency fo becomes N*fi. That is, the frequency adjustment means 400 outputs a signal whose frequency is N times that of the input signal.

The frequency division ratio N mentioned above may be set from the outside, using the frequency division ratio setting means 450. Therefore, according to the present example embodiment, a clock frequency to be output can be set at a desired value. Here, when using a commercial power in Japan as the power source, there are two variations in the frequency, 50 Hz and 60 Hz, but the frequency division ratio may be set taking the frequency variation into consideration.

(Fourth Example Embodiment)

In the present example embodiment, a description will be given of an example of a specific configuration of the variable frequency divider 440 and the frequency division ratio setting means 450. The variable frequency divider 440 includes a counter 441, a coincidence circuit 442 and a flip-flop 443. It further includes a frequency division ratio setting switch 450a as the frequency division ratio setting means.

Figure 4:
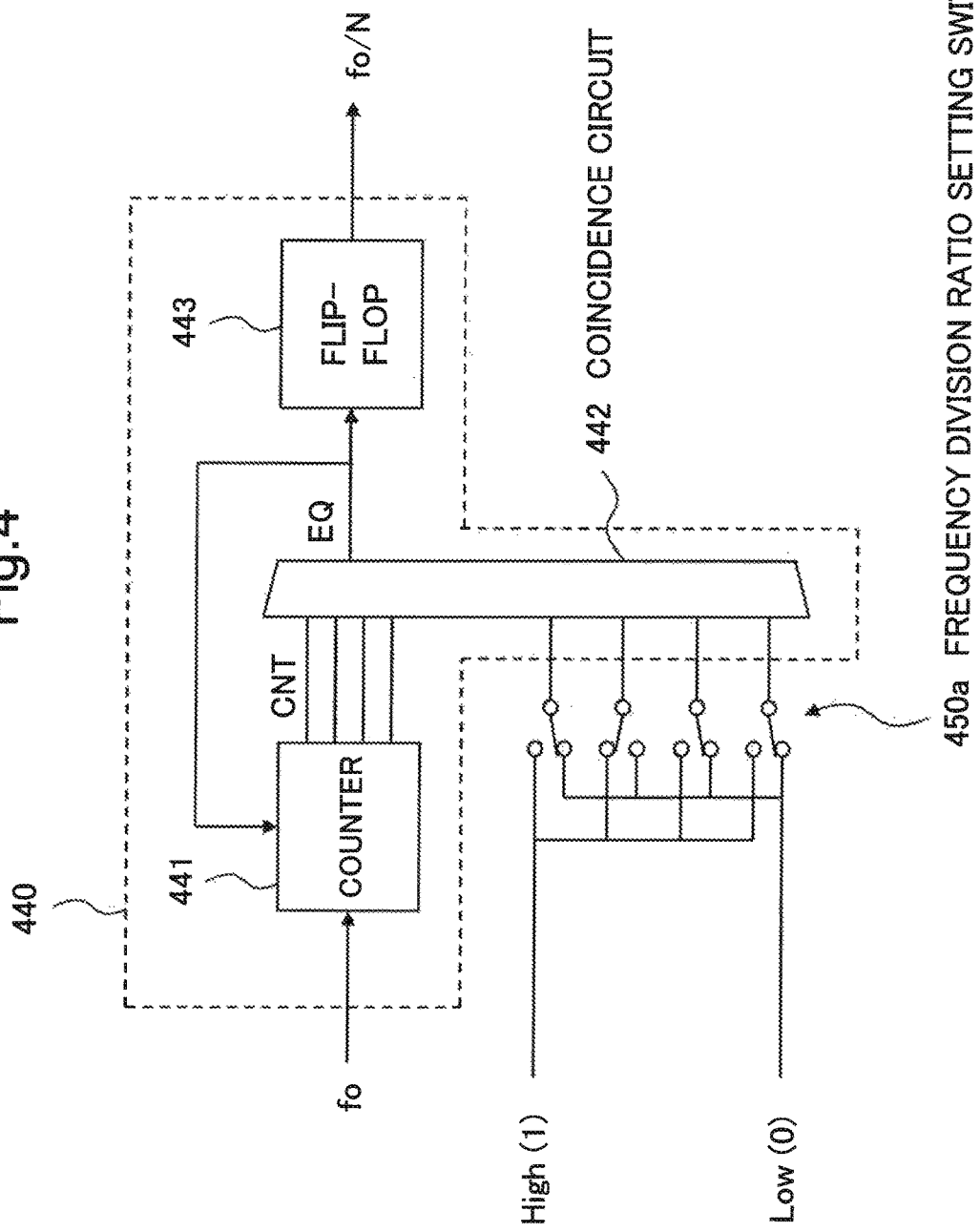
FIG. 4 is a block diagram showing a fourth example embodiment.

The counter 441 counts input pulses (of a frequency fo, here). In the present case, it is assumed that the pulse counting is performed using the binary number system, and accordingly a count value CNT with its digits (four digits in FIG. 4) each being 0 (=Low) or 1 (=High) is output.

In the frequency division ratio setting switch 450a, either of values 0 (=Low) and 1 (=High) is set to each switch element associated with a corresponding one of the digits.

The coincidence circuit 442 outputs a coincidence signal EQ when the count value CNT becomes equal to the setting value of the frequency division ratio set to switch 450a.

The EQ signal is input to the flip-flop 443, and the flip-flop 443 reverses its output every time it receives the EQ signal. Further, the EQ signal is input also to the counter 441, and the counter 441 resets the count value every time it receives the EQ signal.

In the above-described configuration, output of the flip-flop 443 is reversed every time the count number of input pulses becomes equal to a value set by the setting switch. Accordingly, the period of output pulses becomes (period of input pulses)*(set count number)*2, which is assumed to be N. That is, the input frequency is divided into 1/N. In that way, a desired frequency division ratio can be set to the variable frequency divider. Here, the switch may be implemented in any kind of forms and, as an example of a simple form, a dip switch for selecting 0 or 1 in each digit may be used.

As has been described above, according to the present example embodiment, a frequency division ratio can be easily set from the outside. That is, it becomes possible, by only a simple operation, to output a clock signal of a desired frequency from the power supply.

(Fifth Example Embodiment)

Figure 5:
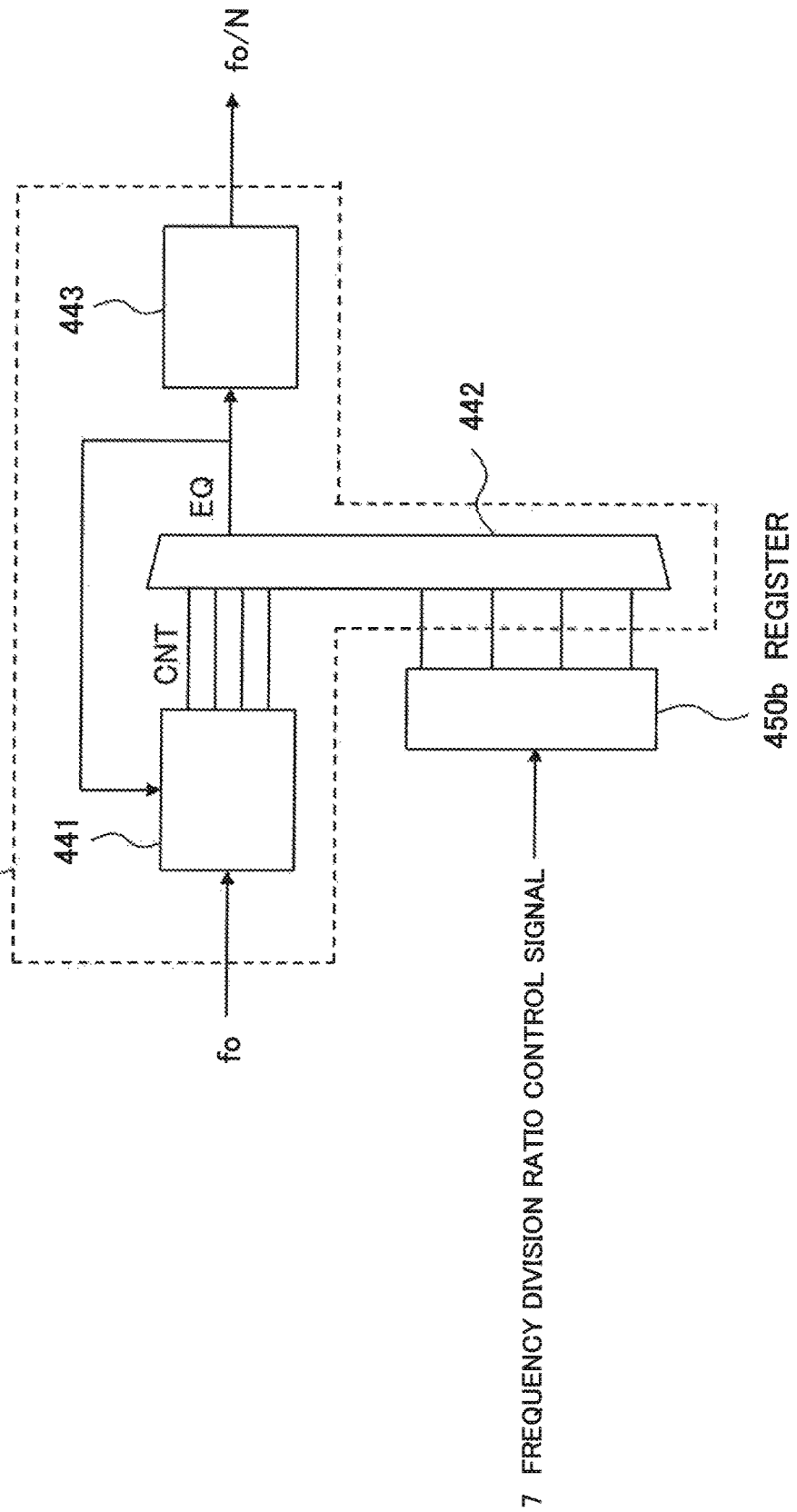
FIG. 5 is a block diagram showing a fifth example embodiment.

FIG. 5 is a block diagram showing a fifth example embodiment. The present example embodiment has a configuration in which the frequency division ratio setting switch 450a of the fourth example embodiment is replaced by a register 450b. The register 450b holds a setting value for obtaining a desired frequency division ratio. The setting value of the register 450b can be set, for example, by a frequency division ratio control signal 7 which is input from the outside. Operation of the variable frequency divider 440 is similar to that in the fourth example embodiment.

(Sixth Example Embodiment)

Figure 6:
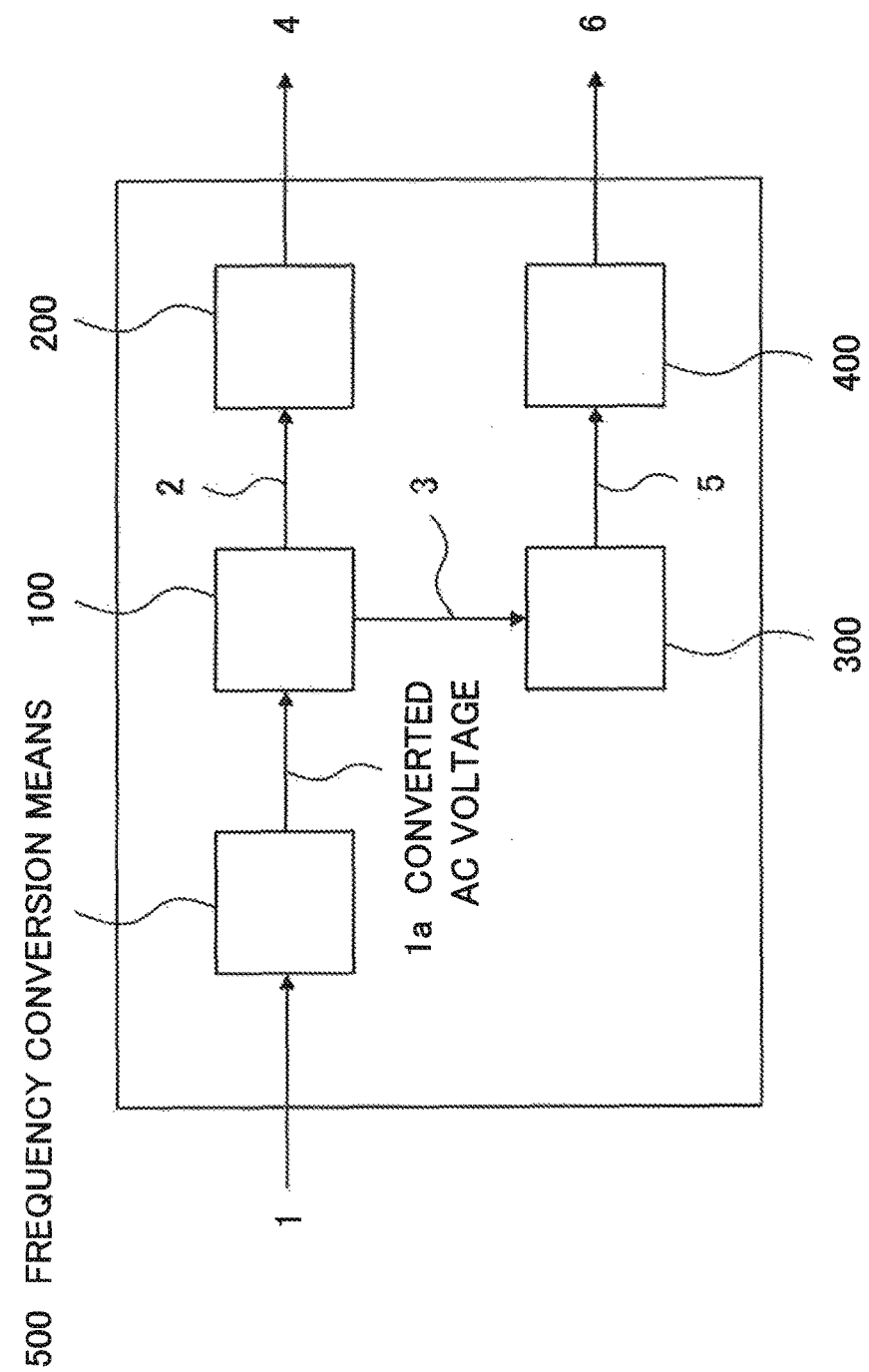
FIG. 6 is a block diagram showing a sixth example embodiment.

FIG. 6 is a block diagram showing a sixth example embodiment. An AC input/DC output power supply 1000 of the present example embodiment includes, in addition to the configuration of the first example embodiment, a frequency conversion means 500 on the input side of the voltage conversion means 100. The frequency conversion means 500 converts a frequency of the AC voltage 1 into a different frequency and thereby outputs a converted AC voltage 1a. Here, a frequency ratio of the conversion performed by the frequency conversion means 500 may be made to be variable. Operation for outputting the DC voltage 4 and the clock signal 6 from the converted AC voltage 1a is similar to that in the first example embodiment and, accordingly, its description will be omitted here.

An advantage of thus converting a frequency of the original power source is that a frequency range of the output clock signal 6 can be changed in accordance with a use case. For example, when a high frequency clock beyond an adjustment range of the frequency adjustment means 400 is needed, the high frequency can be obtained by raising the original frequency.

In the case of making the converted AC voltage 1a be of a raised frequency, there is also an advantage of enabling size reduction of the voltage conversion means 100. It is because when a transformer using electromagnetic induction is employed for the voltage conversion means 100, the transformer can be made smaller with increasing the frequency, theoretically.

As has been described above, according to the present example embodiment, it is possible to increase a frequency adjustment range of a clock signal output from the AC input/DC output power supply, or to reduce the overall device size.

(Seventh Example Embodiment)

FIG. 7 is a block diagram showing a seventh example embodiment. An AC input/DC output power supply 1000 of the present example embodiment can output a plurality of clock signals. For that purpose, the AC input/DC output power supply 1000 includes, in addition to the configuration of the sixth example embodiment, a plurality of frequency adjustment means (400_1, 400_2, . . . and 400_m) at a subsequent stage to the waveform shaping means 300. In the diagram, each dotted arrow directed toward a frequency adjustment means 400 represents frequency setting by manual operation or a control signal. Output frequencies of the respective frequency adjustment means 400_1, 400_2, . . . and 400_m are set independently of each other and, accordingly, clock signals 6_1 (CLK1), 6_2 (CLK2), . . . and 6_m(CLKm) are output respectively. By thus configuring, it becomes possible to simultaneously output a plurality of clock signals. It is general that the number of clock frequencies used in an electric or electronic device is two or more in many cases, and the present example embodiment is suitable for such cases.

While the DC voltage 4 is assumed to be output into only one line here, the configuration may be such that the DC voltage 4 is output into a plurality of lines. Further, a configuration not including the frequency conversion means 500 may be employed.

The present invention has been described above taking the example embodiments described above as exemplary ones. However, the present invention is not limited to the above-described example embodiments. That is, to the present invention, various aspects which can be understood by those skilled in the art may be applied within the scope of the present invention.

This application is based upon and claims the benefit of priority from Japanese Patent Application No. 2015-157120 filed on Aug. 7, 2015, the disclosure of which is incorporated herein in its entirety by reference.

[REFERENCE SIGNS LIST]

1 AC voltage
2 first secondary AC voltage
3 second secondary AC voltage
4 DC voltage
5 square wave voltage signal
6 clock signal
7 frequency division ratio control signal
100 voltage conversion means
200 DC voltage generation means
300 waveform shaping means
400 frequency adjustment means
410 phase/frequency comparator
420 loop filter
430 voltage controlled oscillator 440 variable frequency divider
450 frequency division ratio setting means
500 frequency conversion means

The invention claimed is:

1. An AC input/DC output power supply comprising:
a frequency converter for converting an input AC voltage into an AC voltage of a higher frequency than the frequency of the input AC voltage,
a voltage converter for taking the AC voltage from the frequency converter as input and generating a secondary voltage, splitting the secondary voltage into a first secondary AC voltage and a second secondary AC voltage, and outputting the first and second secondary AC voltages;
a DC voltage generator for receiving the first secondary AC voltage and outputting a predetermined DC voltage to the outside of the AC input/DC output power supply;
a waveform shaper for receiving the second secondary AC voltage and outputting a square wave voltage signal; and
a frequency adjuster for adjusting a frequency of the square wave voltage signal to be a predetermined frequency, and thereby outputting a clock signal to the outside of the AC input/DC output power supply.

2. The AC input/DC output power supply according to claim 1, wherein the frequency adjuster is provided with a frequency setter for setting the clock signal frequency from outside of the frequency adjuster.

3. The AC input/DC output power supply according to claim 1,
wherein the frequency adjuster comprises a PLL frequency division circuit provided with a variable frequency divider.

4. The AC input/DC output power supply according to claim 3,
wherein the variable frequency divider comprises:
a counter configured to count a pulse number of input pulses;
a coincidence circuit configured to output a coincidence signal when the counted pulse number reaches a predetermined value;
a predetermined count value setter for setting the predetermined value; and
a flip-flop configured to reverse its output when the coincidence signal is input to the flip-flop.

5. The AC input /DC output power supply according to claim 4,
wherein the predetermined count value setter is a group of switches configured to set the predetermined value by manual operation.

6. The AC input /DC output power supply according to claim 4,
wherein the predetermined count value setter is a register holding the predetermined value.

7. An AC input/DC output power supply comprising:
a frequency converter for converting an input AC voltage into an AC voltage of a higher frequency than the frequency of the input AC voltage,
a voltage converter for taking the AC voltage from the frequency converter as input and generating a secondary voltage, splitting the secondary voltage into a first secondary AC voltage and a plurality of second secondary AC voltage, and outputting the first and second secondary AC voltages;
a DC voltage generator for receiving the first secondary AC voltage and outputting a predetermined DC voltage to the outside of the AC input/DC output power supply;
a plurality of waveform shaper each for receiving a corresponding one of the plurality of second secondary AC voltages and outputting a square wave voltage signal generated from the second secondary AC voltage; and
a plurality of frequency adjuster each for adjusting a frequency of a corresponding one of the square wave voltage signals to be a predetermined frequency, and thereby outputting a clock signal to the outside of the AC input/DC output power supply.

8. A control method of AC input /DC output power supply, the control method comprising: converting an input AC voltage into an AC voltage of a higher frequency than the frequency of the input AC voltage; converting the AC voltage into a secondary voltage; splitting the secondary voltage into a first secondary AC voltage and a second secondary AC voltage, and outputting the first and second secondary AC voltages; receiving the first secondary AC voltage and outputting a DC voltage of a predetermined voltage value; shaping a waveform of the second secondary AC voltage and thereby outputting a square wave voltage signal ; and receiving the square wave voltage signal and adjusting a frequency of the square wave voltage signal to be a predetermined frequency, thereby outputting a clock signal to the outside of the AC input/DC output power supply.

9. The control method of AC input /DC output power supply according to claim 8,
wherein a frequency of the clock signal is set from outside of the frequency adjuster.

10. The AC input /DC output power supply according to claim 2,
wherein the frequency adjuster comprises a PLL frequency division circuit provided with a variable frequency divider.

11. The AC input /DC output power supply according to claim 10,
wherein the variable frequency divider comprises:
a counter configured to count a pulse number of input pulses;
a coincidence circuit configured to output a coincidence signal when the counted pulse number reaches a predetermined value;
a predetermined count value setter for setting the predetermined value; and a flip-flop configured to reverse its output when the coincidence signal is input to the flip-flop.

12. The AC input /DC output power supply according to claim 11,
wherein the predetermined count value setter is a group of switches configured to set the predetermined value by manual operation.

13. The AC input /DC output power supply according to claim 11,
wherein the predetermined count value setter is a register holding the predetermined value.

* * * * *